(12) United States Patent
Tang et al.

(10) Patent No.: US 12,204,752 B2
(45) Date of Patent: Jan. 21, 2025

(54) SOLID-STATE STORAGE DRIVE AND SOLID-STATE STORAGE DRIVE CONTROL METHOD

(71) Applicant: HUAWEI TECHNOLOGIES CO., LTD., GuangDong (CN)

(72) Inventors: Yongjun Tang, Chengdu (CN); Yongke Tang, Chengdu (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 132 days.

(21) Appl. No.: 17/886,720

(22) Filed: Aug. 12, 2022

(65) Prior Publication Data

US 2022/0391087 A1 Dec. 8, 2022

Related U.S. Application Data

(63) Continuation of application No. PCT/CN2020/075345, filed on Feb. 14, 2020.

(51) Int. Cl.
*G06F 3/06* (2006.01)

(52) U.S. Cl.
CPC ............ *G06F 3/061* (2013.01); *G06F 3/0629* (2013.01); *G06F 3/0679* (2013.01)

(58) Field of Classification Search
CPC ....... G06F 3/061; G06F 3/0629; G06F 3/0679
See application file for complete search history.

(56) References Cited

U.S. PATENT DOCUMENTS

| | | | | |
|---|---|---|---|---|
| 10,838,901 B1 * | 11/2020 | Chinchole | ................. | G06F 1/10 |
| 2009/0196102 A1 | 8/2009 | Kim | | |
| 2009/0319716 A1 * | 12/2009 | Nagadomi | .......... | G06F 12/0246 |
| | | | | 710/316 |
| 2011/0276775 A1 * | 11/2011 | Schuetz | .............. | G06F 13/1673 |
| | | | | 711/E12.002 |
| 2014/0293705 A1 * | 10/2014 | Gillingham | ............. | H01L 25/18 |
| | | | | 365/185.18 |
| 2015/0074331 A1 * | 3/2015 | Endo | ...................... | G11C 16/12 |
| | | | | 711/103 |
| 2019/0065114 A1 * | 2/2019 | Inoue | ..................... | G11C 29/52 |
| 2019/0147958 A1 | 5/2019 | Pascucci et al. | | |

FOREIGN PATENT DOCUMENTS

| | | | |
|---|---|---|---|
| CN | 201812284 U | 4/2011 | |
| CN | 103106155 A | 5/2013 | |
| CN | 107861775 A | 3/2018 | |
| CN | 108008919 A | 5/2018 | |
| CN | 108932204 A | 12/2018 | |

* cited by examiner

*Primary Examiner* — Henry Tsai
*Assistant Examiner* — Harry Z Wang
(74) *Attorney, Agent, or Firm* — Rimon PC (57) ABSTRACT

A solid-state storage drive and a solid-state storage drive control method are provided. The solid-state storage drive includes a controller, a selector, and N NAND flash memory chips, where N is an integer greater than 1. The controller is configured to output a plurality of gating signals to the selector. The plurality of gating signals indicate M of the N NAND flash memory chips, where M is an integer greater than or equal to 1 and less than or equal to N. The selector is configured to select, based on the plurality of gating signals, the M NAND flash memory chips to perform data transmission. This improves an interface rate of the solid-state storage drive, so that performance requirements of a high interface rate and a high storage capacity of the solid-state storage drive can be satisfied.

20 Claims, 5 Drawing Sheets

| NAND Bank | Gating signal | | | | 3-8 decoder input | | | | | 3-8 decoder output | | | | | | | | MUX input | | | MUX output | | | |
|---|---|---|---|---|---|---|---|---|---|---|---|---|---|---|---|---|---|---|---|---|---|---|---|---|
| | CE 0 | CE 1 | CE 2 | CE 3 | C | B | A | G2A | Y0 | Y1 | Y2 | Y3 | Y4 | Y5 | Y6 | Y7 | SEL 0 | SEL 1 | EN_B | IN | A | B | C | D |
| Bank 0 CE 0 | 0 | 0 | 0 | 0 | 0 | 0 | 0 | 0 | 0 | 1 | 1 | 1 | 1 | 1 | 1 | 1 | 0 | 0 | 0 | A | IN | Z | Z | Z |
| CE 1 | 0 | 0 | 0 | 0 | 0 | 0 | 1 | 0 | 1 | 0 | 1 | 1 | 1 | 1 | 1 | 1 | 0 | 0 | 0 | A | IN | Z | Z | Z |
| Bank 1 CE 2 | 0 | 1 | 0 | 0 | 0 | 1 | 0 | 0 | 1 | 1 | 0 | 1 | 1 | 1 | 1 | 1 | 0 | 1 | 0 | B | Z | IN | Z | Z |
| CE 3 | 0 | 1 | 0 | 0 | 0 | 1 | 1 | 0 | 1 | 1 | 1 | 0 | 1 | 1 | 1 | 1 | 0 | 1 | 0 | B | Z | IN | Z | Z |
| Bank 2 CE 4 | 1 | 0 | 0 | 0 | 1 | 0 | 0 | 0 | 1 | 1 | 1 | 1 | 0 | 1 | 1 | 1 | 1 | 0 | 0 | C | Z | Z | IN | Z |
| CE 5 | 1 | 0 | 0 | 0 | 1 | 0 | 1 | 0 | 1 | 1 | 1 | 1 | 1 | 0 | 1 | 1 | 1 | 0 | 0 | C | Z | Z | IN | Z |
| Bank 3 CE 6 | 1 | 1 | 0 | 0 | 1 | 1 | 0 | 0 | 1 | 1 | 1 | 1 | 1 | 1 | 0 | 1 | 1 | 1 | 0 | D | Z | Z | Z | IN |
| CE 7 | 1 | 1 | 0 | 0 | 1 | 1 | 1 | 0 | 1 | 1 | 1 | 1 | 1 | 1 | 1 | 0 | 1 | 1 | 0 | D | Z | Z | Z | IN |
| | 1 | 1 | 1 | 1 | 1 | 1 | 1 | 1 | 1 | 1 | 1 | 1 | 1 | 1 | 1 | 1 | 1 | 1 | 1 | Z | Z | Z | Z | Z |

SOLID-STATE STORAGE DRIVE AND SOLID-STATE STORAGE DRIVE CONTROL METHOD

CROSS-REFERENCE TO RELATED APPLICATIONS

This application is a continuation of International Application No. PCT/CN2020/075345, filed on Feb. 14, 2020, the disclosure of which is hereby incorporated by reference in its entirety.

TECHNICAL FIELD

This application relates to the field of computer technologies, and in particular, to a solid-state storage drive and a solid-state storage drive control method.

BACKGROUND

As the world entered into the Internet era, the exponential growth of data volume poses higher requirements on capacity specifications and interface rates for solid-state storage drives. To meet higher capacity specifications, many NAND flash memory chips are packed in a solid-state storage drive. The NAND flash memory chips are divided into a plurality of channel groups, and a plurality of NAND flash memory chips in each group are connected to a controller of the solid-state storage drive by using a same input/output bus. However, as the quantity of NAND flash memory chips connected to a same input/output bus increases, the load rate of the input/output bus also continuously increases. When the load rate of the input/output bus exceeds a threshold, an interface rate of the solid-state storage drive decreases, and a data read/write delay increases.

In a related technology, to improve the interface rate of the solid-state storage drive and reduce the data read/write delay, the quantity of NAND flash memory chips connected to the input/output bus needs to be reduced, and the load rate of the input/output bus needs to be controlled.

However, if the load rate of the input/output bus is controlled, the capacity specifications of the solid-state storage drive are affected. If the load rate of the input/output bus is not controlled, the interface rate of the solid-state storage drive cannot be improved. Therefore, it is difficult to implement both high interface rate and high capacity specifications of the solid-state storage drive.

SUMMARY

Embodiments of this application provide a solid-state storage drive and a solid-state storage drive control method, to resolve the technical problem that it is difficult to implement both a high interface rate and high capacity specifications of an existing solid-state storage drive.

According to a first aspect, this application provides a solid-state storage drive. The solid-state storage drive includes a controller, a selector, and N NAND flash memory chips, where N is an integer greater than 1. The N NAND flash memory chips form P NAND flash memory chip arrays, where P is an integer greater than or equal to 1 and less than or equal to N. The selector is separately coupled to the controller and the N NAND flash memory chips. The controller is configured to output a plurality of gating signals to the selector. The plurality of gating signals indicate M NAND flash memory chips of the N NAND flash memory chips, where M is an integer greater than or equal to 1 and less than or equal to N. The selector is configured to select, based on the plurality of gating signals, the M NAND flash memory chips to perform data transmission.

The controller outputs gating signals used to indicate a portion of NAND flash memory chips, and the selector selects the portion of NAND flash memory chips indicated by the gating signal to perform data transmission. This effectively resolves a problem that an input/output bus of the solid-state storage drive is heavily loaded, and improves an interface rate of the solid-state storage drive. In addition, a storage capacity of the solid-state storage drive is not limited, and applicability is not restrictive, so that the situation in which an input/output bus of a solid-state storage drive with a large capacity becomes heavily loaded and an interface rate becomes reduced can be effectively resolved.

In a possible design, the selector includes a bus selector and a chip selector. The controller is separately connected to the bus selector and the chip selector. The bus selector is connected to P NAND flash memory chip arrays by using P groups of input/output buses. The chip selector is connected to N NAND flash memory chips. The bus selector is configured to determine one group of the P groups of input/output buses based on each of the gating signals. The chip selector is configured to determine each of the M NAND flash memory chips based on each of the gating signals.

The bus selector and the chip selector are used to select, based on the gating signals output by the controller, a portion of NAND flash memory chips to perform data transmission. This can effectively resolve a problem that the input/output bus of the solid-state storage drive is heavily loaded, and improves the interface rate of the solid-state storage drive. In an NAND flash memory chip gating process, software is not needed, so that software complexity is not increased.

In a possible design, each of the gating signals includes a first signal bit group and a second signal bit group. The bus selector is configured to receive the first signal bit group in each of the gating signals, and determines one group of the P groups of input/output buses based on the first signal bit group. The chip selector is configured to receive the first signal bit group and the second signal bit group in each of the gating signals, and determines each of the M NAND flash memory chips based on the first signal bit group and the second signal bit group.

The bus selector selects the input/output bus based on the first signal bit group of the gating signal, and the chip selector selects the NAND flash memory chip based on the first signal bit group and second signal bit group of the gating signal. As a result, an input/output bus is switched, and gating is performed on an NAND flash memory chip connected to the input/output bus, so that a problem that the input/output bus of the solid-state storage drive with a large capacity is heavily loaded is effectively resolved, the interface rate of the solid-state storage drive with a large capacity is improved, and a data read/write speed of the solid-state storage drive with a large capacity is improved.

In a possible design, an NAND flash memory chip determined by the chip selector based on the first signal bit group and the second signal bit group of a gating signal corresponds to a group of input/output buses determined by the bus selector based on the first signal bit group of the same gating signal.

The bus selector and the chip selector are associated to perform gating for the NAND flash memory chip. The interface rate of the solid-state storage drive is effectively improved, and the storage capacity of the solid-state storage drive is ensured. Moreover, in the NAND flash memory chip gating process, software functionality is not needed. Therefore, software complexity can be kept low, and implementation is simple. This is applicable to various solid-state storage drives that use an NAND flash memory chip.

In a possible design, the bus selector includes a data selector MUX, and the chip selector includes a decoder.

In embodiments of this application, circuit implementation is simple, hardware costs can be kept low, and applicability is wide. This is applicable to various solid-state storage drives that use an NAND flash memory chip.

In a possible design, the selector is further configured to: receive an enabling signal sent by the controller; and control, based on the enabling signal, whether to enable the selector.

In the solid-state storage drive with a large capacity, a plurality of chip selectors and a plurality of bus selectors may be disposed to cooperate with each other to complete a function of selecting an NAND flash memory chip. Whether to enable the selector is controlled by using the enabling signal. This helps ensure effective gating of the NAND flash memory chip and can effectively ensure normal working of the solid-state storage drive with a large capacity.

According to a second aspect, this application provides a controller. The controller is used in a solid-state storage drive. The solid-state storage drive includes a selector and N NAND flash memory chips, where N is an integer greater than 1. The N NAND flash memory chips form P NAND flash memory chip arrays, where P is an integer greater than or equal to 1 and less than or equal to N. The selector is separately coupled to the controller and the N NAND flash memory chips. The controller is configured to output a plurality of gating signals to the selector, so that the selector selects, based on the plurality of gating signals, M NAND flash memory chips to perform data transmission. The plurality of gating signals indicate the M NAND flash memory chips of the N NAND flash memory chips, where M is an integer greater than or equal to 1 and less than or equal to N.

In a possible design, the selector includes a bus selector and a chip selector. The controller is separately connected to the bus selector and the chip selector. The bus selector is connected to P NAND flash memory chip arrays by using P groups of input/output buses. The chip selector is connected to the N NAND flash memory chips. The controller is configured to output the plurality of gating signals to the bus selector, so that the bus selector determines one group of the P groups of input/output buses based on each of the plurality of gating signals. The controller is further configured to output the plurality of gating signals to the chip selector, so that the chip selector determines each of the M NAND flash memory chips based on each of the plurality of gating signals.

In a possible design, each of the gating signals includes a first signal bit group and a second signal bit group. The controller is configured to output the first signal bit group in each of the plurality of gating signals to the bus selector, so that the bus selector determines one group of the P groups of input/output buses based on the first signal bit group in each of the gating signals. The controller is further configured to output the first signal bit group and the second signal bit group in each of the plurality of gating signals to the chip selector, so that the chip selector determines each of the M NAND flash memory chips based on the first signal bit group and the second signal bit group in each of the gating signals.

In a possible design, the controller is further configured to: send an enabling signal to the selector; and control, based on the enabling signal, whether to enable the selector.

According to a third aspect, this application provides a solid-state storage drive control method. The method is applied to a solid-state storage drive. The solid-state storage drive includes the controller, the selector, and the N NAND flash memory chips, where N is a positive integer greater than 1. The N NAND flash memory chips form the P NAND flash memory chip arrays, where P is an integer greater than or equal to 1 and less than or equal to N. The selector is coupled to the controller and the N NAND flash memory chips. In the method, the controller outputs the plurality of gating signals to the selector. The plurality of gating signals indicate the M NAND flash memory chips of the N NAND flash memory chips, where M is a positive integer greater than or equal to 1 and less than or equal to N. The selector selects, based on the plurality of gating signals, the M NAND flash memory chips to perform data transmission.

In a possible design, the selector includes a bus selector and a chip selector. The controller is separately connected to the bus selector and the chip selector. The bus selector is connected to P NAND flash memory chip arrays by using P groups of input/output buses. The chip selector is connected to N NAND flash memory chips. P is a positive integer greater than or equal to 1. In the method, the bus selector determines one group of the P groups of input/output buses based on each gating signal. The chip selector determines each of the M NAND flash memory chips based on each gating signal.

In a possible design, each of the gating signals includes a first signal bit group and a second signal bit group. The bus selector receives the first signal bit group in each of the gating signals, and determines one group of the P groups of input/output buses based on the first signal bit group. The chip selector receives the first signal bit group and the second signal bit group in each of the gating signals, and determines each of the M NAND flash memory chips based on the first signal bit group and the second signal bit group.

In a possible design, an NAND flash memory chip determined by the chip selector based on the first signal bit group and the second signal bit group of any gating signal corresponds to a group of input/output buses determined by the bus selector based on the first signal bit group of the same gating signal.

In a possible design, the bus selector includes a data selector MUX, and the chip selector includes a decoder.

In a possible design, the selector receives an enabling signal sent by the controller; and controls, based on the enabling signal, whether to enable the selector.

According to a fourth aspect, this application provides a terminal device. The terminal device includes the solid-state storage drive according to any implementation of the first aspect.

According to a fifth aspect, this application provides a control system. The control system includes a terminal device and the solid-state storage drive according to any implementation of the first aspect; or the control system includes a network device and the solid-state storage drive according to any implementation of the first aspect.

According to a sixth aspect, this application provides a computer-readable storage medium including instructions. When the instructions are run on a computer, the computer is enabled to perform the method according to any implementation of the second aspect.

Other effects of the foregoing optional manners are described below with reference to specific embodiments.

BRIEF DESCRIPTION OF DRAWINGS

The accompanying drawings are intended for better understanding of this solution, and do not constitute any limitation on this application.

DESCRIPTION OF EMBODIMENTS

Embodiments of this application are applicable to a solid-state storage drive, a terminal device, a control system, or any system that can execute embodiments of this application. The following explains some terms in this application, to facilitate understanding by a person skilled in the art. It should be noted that, when solutions in embodiments of this application are applied to the solid-state storage drive or any system that can execute embodiments of this application, there may be other names for the solid-state storage drive and an NAND flash memory chip, but this does not affect implementation of the solutions in embodiments of this application.

It should be understood that technical solutions in embodiments of this application may be applied to solid-state storage drives used in various communications systems for processing. The communications systems may be, for example, a wireless local area network communications (WLAN) system, a global system for mobile communications (GSM) system, a code division multiple access (CDMA) system, a wideband code division multiple access (WCDMA) system, a general packet radio service (GPRS), a long term evolution (LTE) system, an LTE frequency division duplex (FDD) system, an LTE time division duplex (TDD) system, a universal mobile telecommunications system (UMTS), a worldwide interoperability for microwave access (WiMAX) communications system, a future fifth-generation mobile communications technology (5G) system, or another system that may appear in the future.

Terms used in the implementation parts of this application are merely used to explain specific embodiments of this application, but are not intended to limit this application. In the following some terms in this application are described, to help a person skilled in the art have a better understanding.

(1) A solid-state storage drive (SSD) is configured to store data. The solid-state storage drive may be disposed on a terminal, or the solid-state storage drive may be disposed on a server.

(2) A Flash memory, also referred to as a flash memory, "Flash" for short, is a type of a memory device, and is a non-volatile memory.

(3) An NAND-Flash memory is a type of a Flash memory. A non-linear macrocell mode is used inside the NAND-Flash memory. The NAND-Flash memory has advantages such as a large capacity and a fast rewriting speed, and is applicable to storage of large-scale data.

(4) A dynamic random access memory (DRAM) is a volatile memory. When the dynamic random access memory is powered on, data exists; when the dynamic random access memory is powered off, data flow is lost.

(5) An interface rate indicates a nominal rate at which all processed bits pass through an interface.

(6) "A plurality of" means two or more, and another quantifier is similar to this. The term "and/or" describes an association relationship between associated objects and represents that three relationships may exist. For example, A and/or B may represent the following three cases: Only A exists, both A and B exist, and only B exists. The character "/" generally indicates an "or" relationship between the associated objects.

(7) "Correspondence" may refer to an association or a binding relationship, and that A corresponds to B refers to that there is an association or a binding relationship between A and B.

It should be noted that nouns or terms used in the embodiments of this application may be mutually referenced, and details are not described again.

As the world entered into the Internet era, the exponential growth of data volume poses higher requirements on capacity specifications and interface rates of solid-state storage drives. To meet higher capacity specifications, many NAND flash memory chips are disposed in a solid-state storage drive. The NAND flash memory chips are divided into a plurality of channel groups, and a plurality of NAND flash memory chips in each group are connected to a controller of the solid-state storage drive by using a same input/output bus. However, as the quantity of NAND flash memory chips connected to a same input/output bus increases, the load rate of the input/output bus also continuously increases. When the load rate of the input/output bus exceeds a threshold, an interface rate of the solid-state storage drive decreases, and a data read/write delay increases. In a related technology, to improve the interface rate of the solid-state storage drive and reduce the data read/write delay, the quantity of NAND flash memory chips connected to the input/output bus needs to be reduced, and the load rate of the input/output bus needs to be controlled.

When the solid-state storage drive is used as a large cache and a level-2 cache, for example, when the solid-state storage drive is specifically used as a PCIe solid-state storage acceleration card, a high-performance acceleration card, or a PCIe flash memory card, increasing a storage capacity of the solid-state storage drive and ensuring an interface rate of the solid-state storage drive are important factors for improving overall performance of the solid-state storage drive. When the solid-state storage drive is used together with a conventional disk to form hierarchical storage, the solid-state storage drive is required to have large-capacity storage, a high read/write capability, and a low data delay as well. However, if the load rate of the input/output bus is controlled, the capacity specifications of the solid-state storage drive are reduced. If the load rate of the input/output bus is not controlled, the interface rate of the solid-state storage drive cannot be improved. Therefore, it is difficult to implement both high interface rate performance and high capacity specification performance of the solid-state storage drive.

This application provides a solution to the foregoing problem. The following describes technical solutions of embodiments in this application with reference to accompanying drawings.

Figure 1:
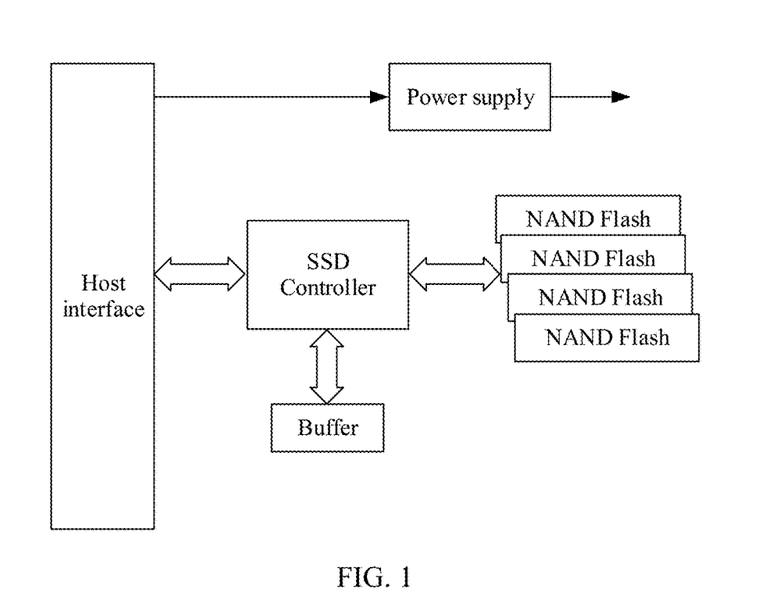
FIG. 1 is a schematic diagram of an application scenario according to an embodiment of this application.

FIG. 1 is a schematic diagram of an application scenario according to an embodiment of this application. As shown in FIG. 1, this embodiment is applicable to a solid-state storage drive SSD.

Figure 2:
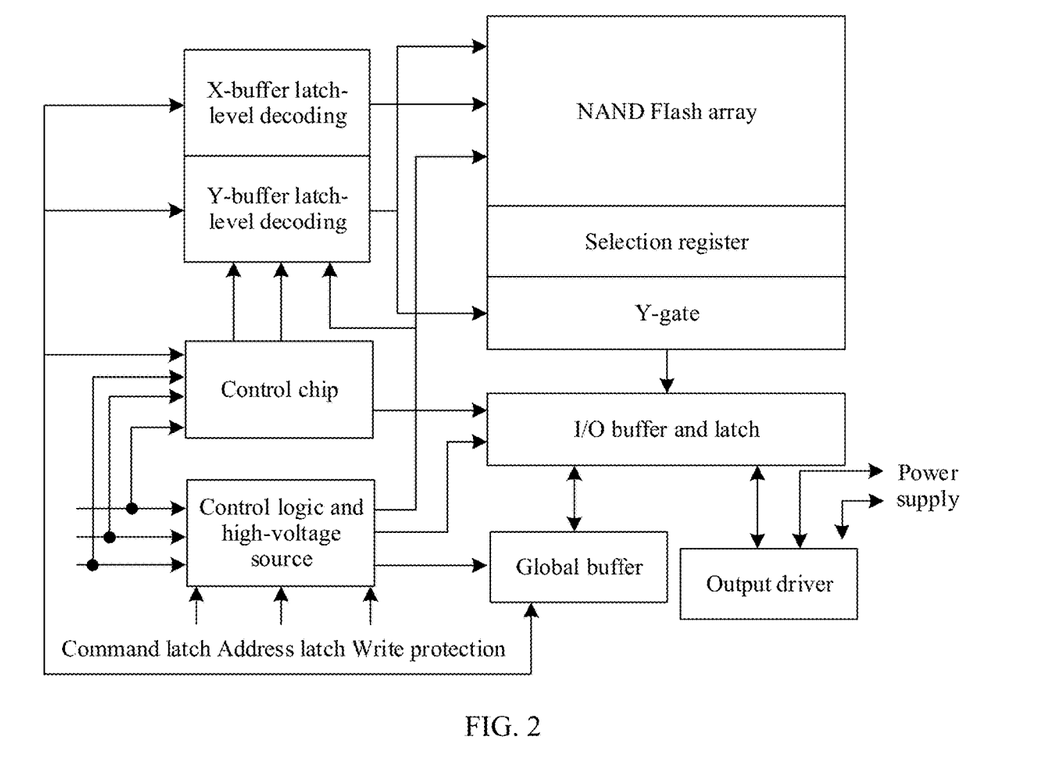
FIG. 2 is a schematic diagram of another application scenario according to an embodiment of this application.

FIG. 2 is a schematic diagram of another application scenario according to an embodiment of this application. As shown in FIG. 2, this embodiment is applicable to an NAND flash memory on which a control chip is installed.

Figure 3:
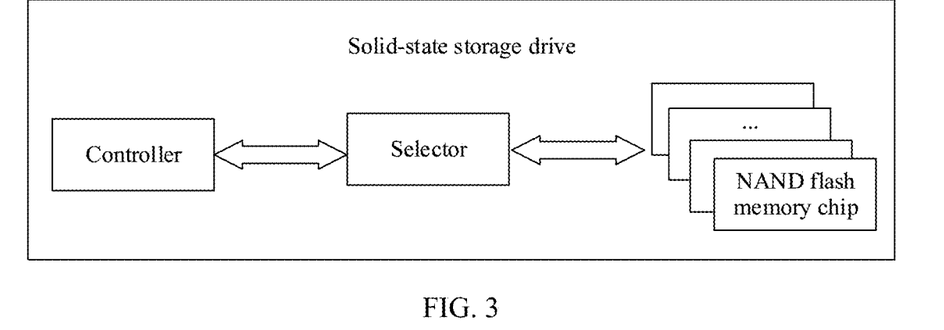
FIG. 3 is a schematic diagram of a structure of a solid-state storage drive according to an embodiment of this application.

FIG. 3 is a schematic diagram of a structure of a solid-state storage drive according to an embodiment of this application. As shown in FIG. 3, the solid-state storage drive includes a controller 301, a selector 302, and N NAND flash memory chips 303, where N is an integer greater than 1. The N NAND flash memory chips form P NAND flash memory chip arrays, where P is an integer greater than or equal to 1 and less than or equal to N. The selector 302 is coupled to the controller 301 and the N NAND flash memory chips 303. The controller 301 is configured to output a plurality of gating signals to the selector 302. The plurality of gating signals indicate M NAND flash memory chips 303 of the N NAND flash memory chips 303, where M is an integer greater than or equal to 1 and less than or equal to N. The selector 302 is configured to select, based on the plurality of gating signals, the M NAND flash memory chips 303 to perform data transmission.

In some embodiments, specifically, to implement large-capacity storage of the solid-state storage drive, the N NAND flash memory chips 303 are disposed in the solid-state storage drive, where N is an integer greater than 1. The N NAND flash memory chips 303 form the P NAND flash memory chip arrays. The P NAND flash memory chip arrays are connected to the selector 302 of the solid-state storage drive by using input/output buses. The selector 302 is connected to the controller 301 of the solid-state storage drive by using an input/output bus. The N NAND flash memory chips 303 are divided into channel groups based on different connected input/output buses. Each group corresponds to a plurality of NAND flash memory chips 303, and the plurality of NAND flash memory chips 303 corresponding to each group are connected to the selector 302 by using a same input/output bus. NAND flash memory chips 303 corresponding to different groups are connected to the selector 302 by using parallel input/output buses. In other words, the N NAND flash memory chips 303 are divided into the channel groups to obtain the P NAND flash memory chip arrays. Each NAND flash memory chip array is connected to the selector 302 by using a same input/output bus, and different NAND flash memory chip arrays are connected to the selector 302 by using parallel input/output buses. As the performance and security level of the solid-state storage drive continuously improve, an amount of information exchanged between a data system and the solid-state storage drive becomes larger, and a load rate of an input/output bus of the solid-state storage drive is continuously increased. A higher load rate indicates more nodes on the input/output bus, a larger distributed capacitance of the input/output bus, a longer discharge time period needed for returning from an explicit level to an invisible level, and a lower interface rate of the input/output bus. To ensure that a data transmission delay is within an acceptable range, utilization of the input/output bus does not exceed a specific threshold. A lower load rate of the input/output bus indicates that real-time performance of the input/output bus can be better ensured. However, if the load rate of the input/output bus is too low, the input/output bus cannot transmit sufficient data. Therefore, the controller 301 outputs the plurality of gating signals, indicates the M NAND flash memory chips 303 of the N NAND flash memory chips 303 by using the plurality of gating signals, and then the selector 302 selects the indicated M NAND flash memory chips 303 to perform data transmission.

The controller 301 is configured to indicate a portion of NAND flash memory chips 303 of the plurality of NAND flash memory chips 303 of the solid-state storage drive. To be specific, the controller 301 outputs the plurality of gating signals to the selector 302, where the plurality of gating signals indicate the M NAND flash memory chips 303 of the N NAND flash memory chips 303. The selector 302 selects, sequentially based on each of the plurality of gating signals, the M NAND flash memory chips 303 that are among the N NAND flash memory chips 303 and that are indicated by the controller 301, to perform data transmission. The design of the selector 302 is to select, by using a hardware circuit, a portion of NAND flash memory chips 303 connected to the input/output bus, to perform data transmission. The load rate of the input/output bus of the solid-state storage drive is effectively reduced. This ensures the capacity specifications of the solid-state storage drive while ensuring the interface rate of the solid-state storage drive. In addition, software is not needed in selection among the NAND flash memory chips 303. Software complexity is not increased and implementation is simple.

In this embodiment, the solid-state storage drive includes the controller, the selector, and the N NAND flash memory chips, where N is an integer greater than 1. The N NAND flash memory chips form the P NAND flash memory chip arrays, where P is an integer greater than or equal to 1 and less than or equal to N. The selector is separately coupled to the controller and the N NAND flash memory chips. The controller is configured to output the plurality of gating signals to the selector. The plurality of gating signals indicate the M NAND flash memory chips of the N NAND flash memory chips, where M is an integer greater than or equal to 1 and less than or equal to N. The controller outputs gating signals used to indicate a portion of NAND flash memory chips, and the selector selects the portion of NAND flash memory chips indicated by the controller to perform data transmission. The load rate of the input/output bus of the solid-state storage drive is determined by a quantity of real-time gating NAND flash memory chips connected to the input/output bus. In this solution, the N NAND flash memory chips of the solid-state storage drive are divided into P NAND flash memory chip arrays. The controller outputs the gating signals. A portion of NAND flash memory chips in the P NAND flash memory chip arrays are selected to perform data transmission. This reduces the quantity of real-time gating NAND flash memory chips connected to the input/output bus, effectively resolves a problem that the input/output bus of the large-capacity solid-state storage drive is heavily loaded, and helps effectively increase the interface rate of the solid-state storage drive with a large capacity. Compared with the approach of reducing a quantity of NAND flash memory chips configured for an input/output bus to ensure an interface rate of a solid-state storage drive with a large capacity, this technical solution can effectively ensure the capacity specifications of the solid-state storage drive. Selection among the NAND flash memory chips is implemented by using hardware circuit, and software is not needed in selection among the NAND flash memory chips, so that software complexity is not increased, and circuit implementation is simple.

Figure 4:
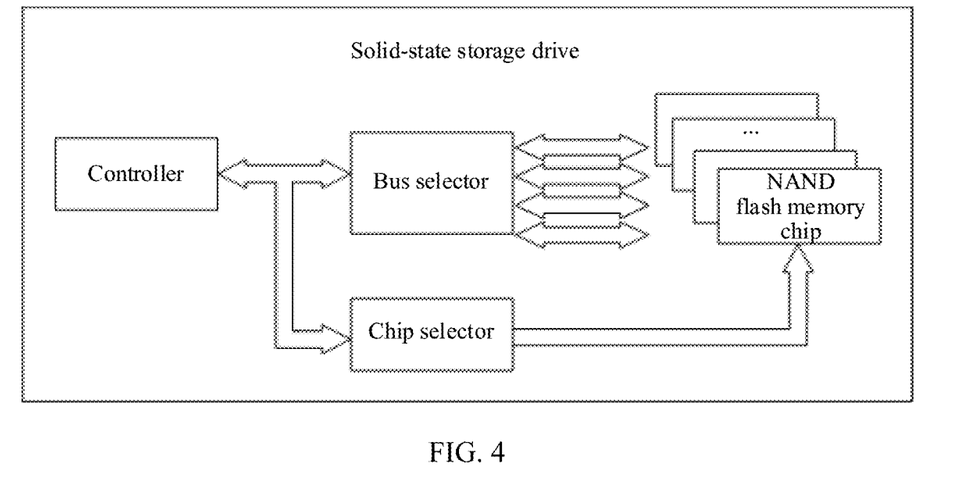
FIG. 4 is a schematic diagram of a structure of another solid-state storage drive according to an embodiment of this application.

FIG. 4 is a schematic diagram of a structure of another solid-state storage drive according to an embodiment of this application. As shown in FIG. 4, the solid-state storage drive includes a controller 401, a selector, and N NAND flash memory chips 404, where N is an integer greater than 1. The N NAND flash memory chips 404 form P NAND flash memory chip arrays. The selector is separately coupled to the controller 401 and the N NAND flash memory chips 404. The controller 401 is configured to output a plurality of gating signals to the selector. The plurality of gating signals indicate M NAND flash memory chips 404 of the N NAND flash memory chips 404, where M is an integer greater than or equal to 1 and less than or equal to N. The selector is configured to select, based on the plurality of gating signals, the M NAND flash memory chips 404 to perform data transmission.

In some embodiments, the selector specifically includes a bus selector 402 and a chip selector 403. The controller 401 is separately connected to the bus selector 402 and the chip selector 403. The bus selector 402 is connected to the P NAND flash memory chip arrays by using P groups of input/output buses. The chip selector 403 is connected to the N NAND flash memory chips 404. P is a positive integer greater than or equal to 1. The bus selector 402 is configured to determine one group of the P groups of input/output buses based on each of the gating signals. The chip selector 403 is configured to determine each of the M NAND flash memory chips 404 based on each of the gating signals.

The bus selector 402 is connected to the controller 401 using a group of input/output buses, and is connected to the P NAND flash memory chip arrays using the P groups of input/output buses. Each NAND flash memory chip array is connected to the bus selector 402 by using a same input/output bus, and different NAND flash memory chip arrays are connected to the bus selector 402 by using parallel input/output buses. The bus selector 402 receives each gating signal from the controller 401 by using the input/output bus, and selects, based on each gating signal, one group of input/output buses from the P groups of input/output buses connected to the P NAND flash memory chip arrays, in other words, selects one NAND flash memory chip array based on each gating signal. The chip selector 403 is connected to the controller 401 by using one group of input/output buses. Specifically, the chip selector 403 and the bus selector 402 are connected to the controller 401 by using the same group of input/output buses, and receive the same gating signal from the controller 401 by using the same group of input/output buses. The chip selector 403 includes a plurality of output ports. Different output ports of the plurality of output ports are separately connected to different chip enable pins of the N NAND flash memory chips 404. The chip selector 403 receives a gating signal from the controller 401 by using the input/output bus, selects, based on the gating signal, one NAND flash memory chip 404 from the N NAND flash memory chips 404 connected to the chip selector 403, and finally determines each of the M NAND flash memory chips 404.

The controller 401 is separately connected to the bus selector 402 and the chip selector 403 by using the input/output buses. The controller 401 outputs the plurality of gating signals to the bus selector 402 and the chip selector 403. Each of the plurality of gating signals includes a first signal bit group and a second signal bit group. The bus selector 402 receives the first signal bit group in each of the gating signals by using the input/output bus, and determines one group of P groups of input/output buses based on the first signal bit group in each of the gating signals. The chip selector 403 receives the first signal bit group and the second signal bit group in each of the gating signals by using the input/output bus, and determines each NAND flash memory chip 404 of the M NAND flash memory chips 404 based on the first signal bit group and the second signal bit group.

Each of the gating signals output by the controller 401 by using the input/output bus includes a first signal bit group and a second signal bit group, and the first signal bit group and the second signal bit group form a complete gating signal. For example, the first signal bit group is 10, the second signal bit group is 1, and the first signal bit group and the second signal bit group form a complete gating signal 101. The bus selector 402 receives the first signal bit group in each of the gating signals by using the input/output bus, and selects, based on the first signal bit group, one group of input/output buses from the P groups of input/output buses connected to the bus selector 402. The selected group of input/output buses is correspondingly connected to one NAND flash memory chip array. One NAND flash memory chip array may include a plurality of NAND flash memory chips 404. The chip selector 403 receives the first signal bit group and the second signal bit group in each of the gating signals via the input/output bus, and selects, based on the first signal bit group and the second signal bit group, one NAND flash memory chip 404 from the N NAND flash memory chips 404 connected to the chip selector 403. The chip selector 403 determines each of the M NAND flash memory chips 404 by receiving the plurality of gating signals output by the controller 401. Because the bus selector 402 receives a portion of a gating signal and the chip selector 403 receives the complete signal of the same gating signal, an NAND flash memory chip 404 determined by the chip selector 403 based on the first signal bit group and the second signal bit group of a gating signal corresponds to one group of input/output buses determined by the bus selector 402 based on the first signal bit group of the same gating signal. In other words, an NAND flash memory chip 404 determined by the chip selector 403 based on a complete signal of any gating signal is one NAND flash memory chip 404 in a NAND flash memory chip array connected to a group of input/output buses determined by the bus selector 402 based on a portion of the same gating signal.

Specifically, the bus selector 402 in the selector includes a data selector MUX, and the chip selector 403 includes a decoder. The data selector MUX can select any channel of data according to a requirement during transmission of a plurality of channels of data, and is also referred to as a multiplexer or a multi-switch. For example, the bus selector 402 in the solid-state storage drive is a 1:4 MUX. The 1:4 MUX is connected to four NAND flash memory chip arrays by using four groups of input/output buses. The 1:4 MUX selects one group of input/output buses from the four groups of input/output buses based on a first signal bit group of a gating signal output by the controller 401. The chip selector 403 in the solid-state storage drive is a 3-8 decoder. Eight output ports of the 3-8 decoder are each connected to a chip enable pin of one NAND flash memory chip 404. The 3-8 decoder decodes a first signal bit group and a second signal bit group of a received gating signal, and selects a connected NAND flash memory chip 404 by outputting a low level at an output port.

Optionally, the selector is further configured to: receive an enabling signal sent by the controller 401; and control, based on the enabling signal, whether to enable the selector. The chip selector 403 and the bus selector 402 in the selector receive the same enabling signal, where the enabling signal can be used to control whether to enable the chip selector 403 and the bus selector 402. In a solid-state storage drive with a large capacity, a plurality of chip selectors 403 and a plurality of bus selectors 402 may be installed and configured to cooperate with each other to complete a selection function of the NAND flash memory chip 404, and an enabling signal can be used to control selectors to be started.

This embodiment is further applicable to various memory components that use an NAND flash memory chip and that are configured to store programs and various data information, including but not limited to a solid-state storage drive SSD, a Flash memory, an NAND-Flash memory, a mobile phone, a storage card, and the like.

In some embodiments, the solid-state storage drive includes the controller, the selector, and the N NAND flash memory chips, where N is an integer greater than 1. The N NAND flash memory chips form the P NAND flash memory chip arrays, where P is an integer greater than or equal to 1 and less than or equal to N. The selector is separately coupled to the controller and the N NAND flash memory chips. The controller is configured to output the plurality of gating signals to the selector. The plurality of gating signals indicate the M NAND flash memory chips of N NAND flash memory chips, where M is an integer greater than or equal to 1 and less than or equal to N. The selector is configured to select, based on the plurality of gating signals, the M NAND flash memory chips to perform data transmission. The selector includes the bus selector and the chip selector. The controller is separately connected to the bus selector and the chip selector. The bus selector is connected to the N NAND flash memory chips by using the P groups of input/output buses, and the chip selector is connected to the N NAND flash memory chips, where P is a positive integer greater than or equal to 1. The bus selector is configured to determine one group of P groups of input/output buses based on each of the gating signals. The chip selector is configured to determine each of the M NAND flash memory chips based on each of the gating signals. The bus selector and the chip selector are associated to perform gating among NAND flash memory chips. In an NAND flash memory chip gating process, software is not needed, so that software complexity is not increased. An input/output bus is switched, and gating is performed on an NAND flash memory chip connected to the input/output bus. In this way, a problem that an input/output bus of a solid-state storage drive with a large capacity is heavily loaded is effectively resolved, an interface rate of the solid-state storage drive with a large capacity is effectively improved, and a data read/write speed of the solid-state storage drive with a large capacity is effectively improved. A quantity of NAND flash memory chips of the solid-state storage drive is not limited, and a storage capacity of the solid-state storage drive is not affected, so that a coupling relationship between the interface rate and the storage capacity of the solid-state storage drive is well balanced, and the requirements of both a high interface rate and a high storage capacity of the solid-state storage drive can be satisfied. The circuit implementation disclosed herein is simple, hardware costs are kept low, and the solid-state storage drive implementation disclosed herein is applicable to various solid-state storage drives that use an NAND flash memory chip.

Figure 5:
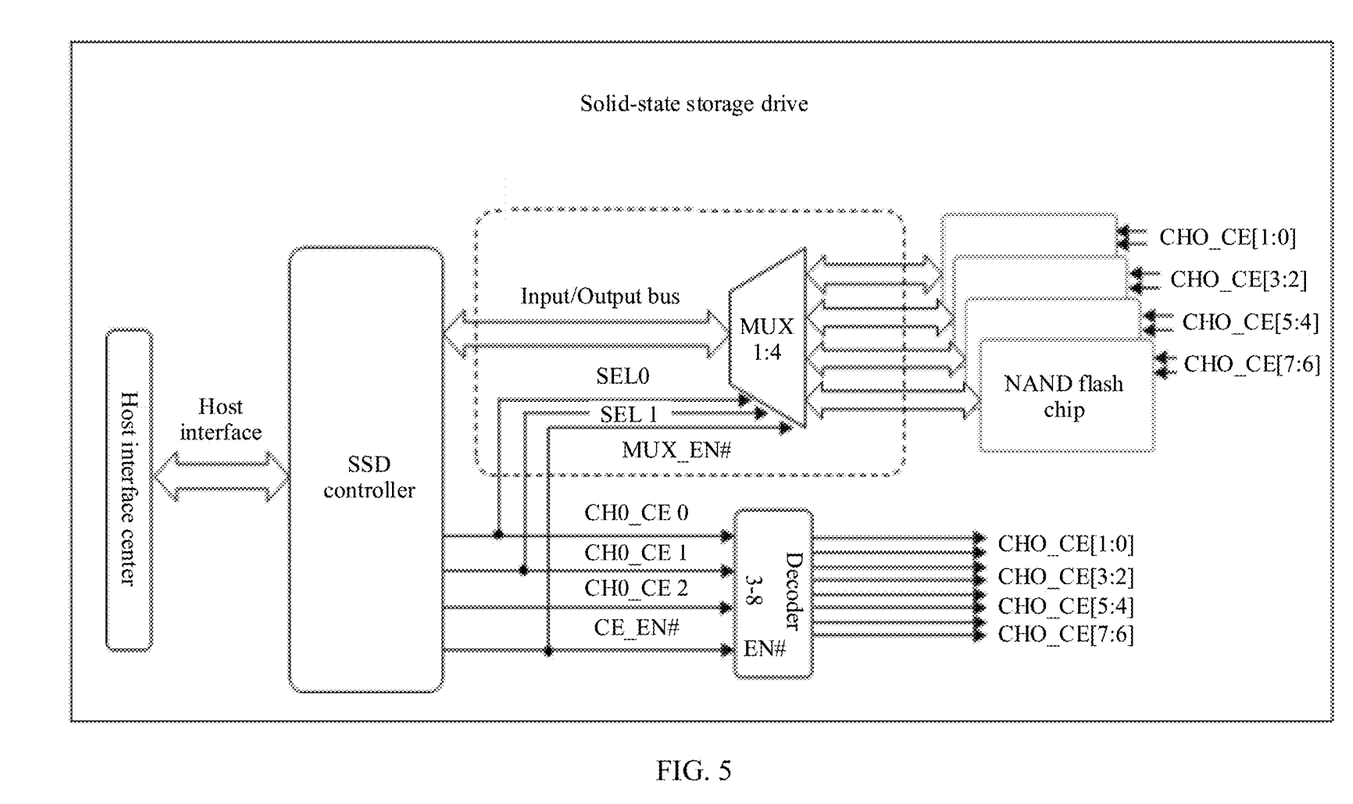
FIG. 5 is a schematic diagram of a structure of still another solid-state storage drive according to an embodiment of this application.

FIG. 5 is a schematic diagram of a structure of still another solid-state storage drive according to an embodiment of this application. The solid-state storage drive is a hard disk drive that uses an NAND Flash semiconductor as a storage medium. The biggest advantage of the solid-state storage drive is that the solid-state storage drive can provide a read/write performance hundreds of times better than that of a hard disk drive HDD. Main components of the solid-state storage drive include an SSD controller 501, a DRAM buffer, an NAND Flash nonvolatile storage device, and a power module. To implement large capacity storage of the solid-state storage drive SSD, a large quantity of NAND Flash non-volatile storage devices are usually used as NAND flash memory chips 504 of the solid-state storage drive SSD. The NAND flash memory chips 504 are divided into a plurality of channel groups, to form a plurality of NAND flash memory chip arrays.

As shown in FIG. 5, a selector in the solid-state storage drive SSD includes a bus selector and a chip selector. The bus selector is a 1:4 MUX 502, the chip selector is a 3-8 decoder 503, and the SSD controller 501 is separately connected to the bus selector 1:4 MUX 502 and the chip selector 3-8 decoder 503. One channel group of the solid-state storage drive SSD includes eight NAND flash memory chips 504. Chip enable pins of the eight NAND flash memory chips 504 are CH0_CE 0 to CH0_CE 7. The eight NAND flash memory chips form four NAND flash memory chip arrays, and the bus selector 1:4 MUX 502 is connected to the four NAND flash memory chip arrays by using four groups of input/output buses. Eight output ports of the chip selector 3-8 decoder 503 are separately connected to the chip enable pins CH0_CE 0 to CH0_CE 7 of the eight NAND flash memory chips 504.

The SSD controller 501 outputs a plurality of gating signals to the bus selector 1:4 MUX 502 and the chip selector 3-8 decoder 503 through an input/output bus. Each of the plurality of gating signals includes a first signal bit group CE 0 to CE 1 and a second signal bit group CE 2. The bus selector 1:4 MUX 502 receives the first signal bit group CE 0 to CE 1 in each gating signal as a channel selection signal SEL 0 to SEL 1, where SEL 0 and SEL 1 is the same as CE 0 and CE 1, respectively. The chip selector 3-8 decoder 503 receives the first signal bit group CE 0 to CE 1 and the second signal bit group CE 2 in each gating signal as a channel selection signal.

In the bus selector 1:4 MUX 502, SEL 0 and SEL 1 are the channel selection signal. Two binary bits may be used to indicate four states. The four states respectively correspond to four groups of input/output buses. In other words, a group of input/output buses can be selected based on SEL 0 and SEL 1. The first signal bit group in each of the gating signals received by the bus selector 1:4 MUX 502 includes 00, 01, 10, and 11. The bus selector 1:4 MUX 502 outputs 0, 1, 2, or 3 for selection among the four groups of input/output buses.

In the chip selector 3-8 decoder 503, CE 0 to CE 2 are a channel selection signal (where CE 0 is SEL 0, and CE 1 is SEL 1). Three binary bits can be used to indicate eight states. The eight states each correspond to selecting a chip enable pin of one of the eight NAND flash memory chips 504. In other words, one NAND flash memory chip 504 may be selected based on CE 0 to CE 2. The first signal bit group in each of the gating signals received by the chip selector 3-8 decoder 503 includes 00, 01, 10, and 11. The second signal bit group includes 0 and 1. The chip selector 3-8 decoder 503 outputs a low level at one of the eight output ports, to implement enabling selection among the eight NAND flash memory chips 504.

Figure 6:
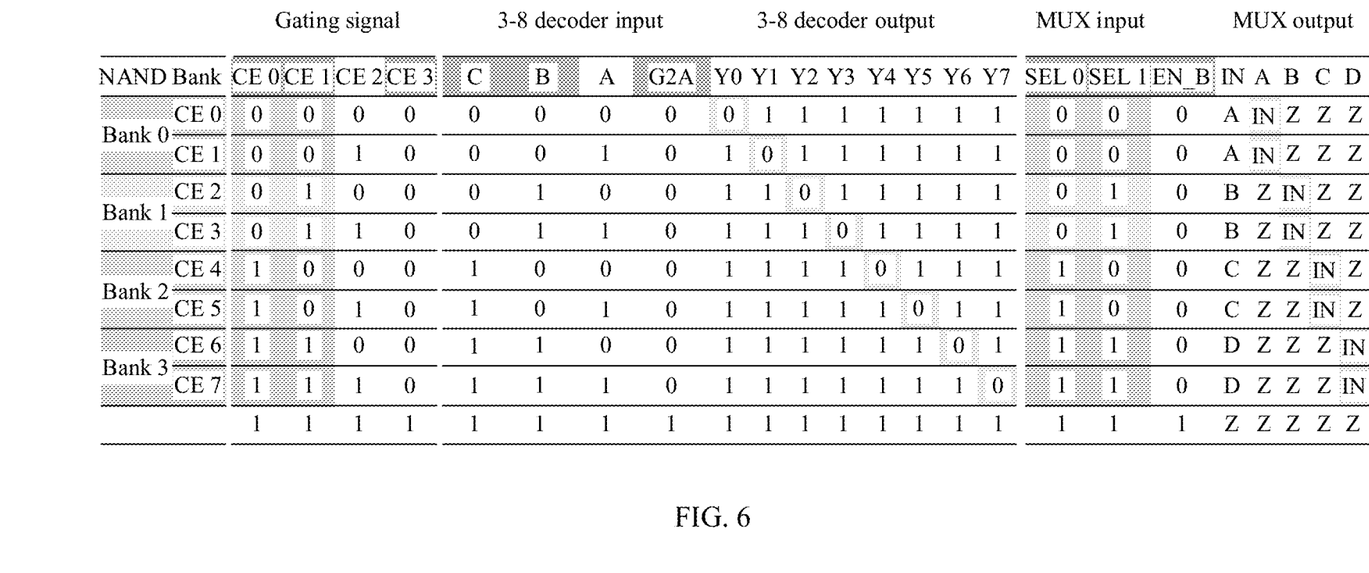
FIG. 6 is a schematic diagram of control logic of a bus selector and a chip selector according to an embodiment of this application.

FIG. 6 is a schematic diagram of control logic of the bus selector and the chip selector according to an embodiment of this application. Because both the bus selector and the chip selector receive the first signal bit group in each of the gating signals, the selection of an input/output bus is synchronized with the enabling selection of an NAND flash memory chip 504. An NAND flash memory chip 504 determined by the chip selector based on a first signal bit group and a second signal bit group of any gating signal corresponds to a group of input/output buses determined by the bus selector based on the first signal bit group of the same gating signal. For example, a first signal bit group of a gating signal is 01, a second signal bit group is 1. The bus selector 1:4 MUX 502 receives the first signal bit group 01 of the gating signal, and determines an input/output bus 1 based on the first signal bit group 01 of the gating signal, in other words, selects the second input/output bus. The chip selector 3-8 decoder 503 receives the first signal bit group 01 and the second signal bit group 1 of the gating signal, and determines, based on the first signal bit group 01 and the second signal bit group 1 of the gating signal, to output a low level at an output port 3. A chip enable pin corresponding to an NAND flash memory chip 5043 is at a low level. This example implement can be used to make an enabling selection of the NAND flash memory chip 5043. The NAND flash memory chip 5043 corresponds to the second input/output bus.

The SSD controller 501 further outputs an enabling signal to the selector, to control whether to enable the selector. An enabling signal MUX_EN # received by the bus selector 1:4 MUX 502 and an enabling signal CE_EN # received by the chip selector 3-8 decoder 503 can be a same enabling signal, so that the bus selector 1:4 MUX 502 and the chip selector 3-8 decoder 503 have a same enabling status.

In some embodiments, the solid-state storage drive SSD includes the SSD controller, the selector, and the N NAND flash memory chips, where N is an integer greater than 1. The selector is separately connected to the controller and the N NAND flash memory chips. The controller is configured to output the plurality of gating signals to the selector. The plurality of gating signals indicate the M NAND flash memory chips of N NAND flash memory chips, where M is an integer greater than or equal to 1 and less than or equal to N. The selector is configured to select, based on the plurality of gating signals, the M NAND flash memory chips to perform data transmission. The selector includes the bus selector and the chip selector. The controller is separately connected to the bus selector and the chip selector. The bus selector is connected to the N NAND flash memory chips by using the P groups of input/output buses, and the chip selector is connected to the N NAND flash memory chips, where P is a positive integer greater than or equal to 1. The bus selector is configured to determine one group of P groups of input/output buses based on each of the gating signals. The chip selector is configured to determine each of the M NAND flash memory chips based on each of the gating signals. The bus selector and the chip selector are associated, to perform gating among NAND flash memory chips. A NAND flash memory chip gating manner is easy to implement, and hardware costs can be kept low. In an NAND flash memory chip gating process, software is not needed, and software complexity is not increased. An input/output bus is switched, and gating is performed on an NAND flash memory chip connected to the input/output bus, so that a problem of an excessively high input/output bus load rate of the solid-state storage drive SSD is effectively resolved, an interface rate of the solid-state storage drive SSD is effectively improved, a data read/write speed of the solid-state storage drive SSD is effectively improved. A coupling relationship between the interface rate and a storage capacity of the solid-state storage drive SSD is better balanced, and the requirements of both a high interface rate and a high storage capacity of the solid-state storage drive SSD can be satisfied. Circuit implementation is simple, and hardware costs are not high. This helps control the hardware costs of solid-state storage drive SSD.

Figure 7:
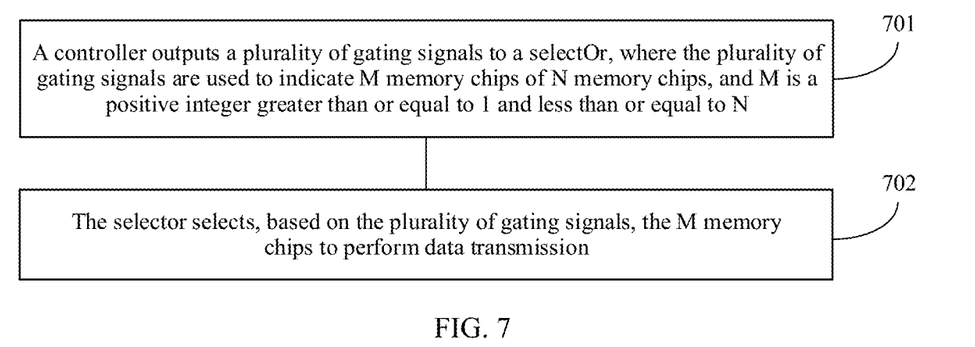
FIG. 7 is a flowchart of a solid-state storage drive control method according to an embodiment of this application.

FIG. 7 is a flowchart of a solid-state storage drive control method according to an embodiment of this application. The method is applied to a solid-state storage drive. The solid-state storage drive includes a controller, a selector, and N NAND flash memory chips, where N is a positive integer greater than 1. The N NAND flash memory chips form P NAND flash memory chip arrays, where P is an integer greater than or equal to 1 and less than or equal to N. The selector is coupled to the controller and the N NAND flash memory chips. As shown in FIG. 7, the method includes the following steps.

Step 701: The controller outputs a plurality of gating signals to the selector, where the plurality of gating signals indicate M NAND flash memory chips of the N NAND flash memory chips, and M is a positive integer greater than or equal to 1 and less than or equal to N.

Step 702: The selector selects, based on the plurality of gating signals, the M NAND flash memory chips to perform data transmission.

In some embodiments, the method shown in FIG. 7 may be applied to the solid-state storage drive. The solid-state storage drive includes the controller, the selector, and the N NAND flash memory chips, where N is a positive integer greater than 1. The N NAND flash memory chips form the P NAND flash memory chip arrays, where P is an integer greater than or equal to 1 and less than or equal to N. The selector is coupled to the controller and the N NAND flash memory chips. The method includes: The controller outputs the plurality of gating signals to the selector. The plurality of gating signals indicate the M NAND flash memory chips of the N NAND flash memory chips, where M is a positive integer greater than or equal to 1 and less than or equal to N. The selector selects, based on the plurality of gating signals, the M NAND flash memory chips to perform data transmission. The controller outputs gating signals used to indicate a portion of NAND flash memory chips, and the selector selects the portion of NAND flash memory chips indicated by the controller to perform data transmission. This effectively resolves a problem that the input/output bus of the large-capacity solid-state storage drive is heavily loaded, and helps effectively increase the interface rate of the solid-state storage drive with a large capacity. Compared with the approach of reducing a quantity of NAND flash memory chips configured for an input/output bus to ensure an interface rate of a solid-state storage drive with a large capacity, this technical solution can effectively ensure the capacity specifications of the solid-state storage drive. Selection among the NAND flash memory chips is implemented by using the hardware circuit, and software is not needed in selection among the NAND flash memory chips, so that software complexity is not increased, and circuit implementation is simple.

Figure 8:
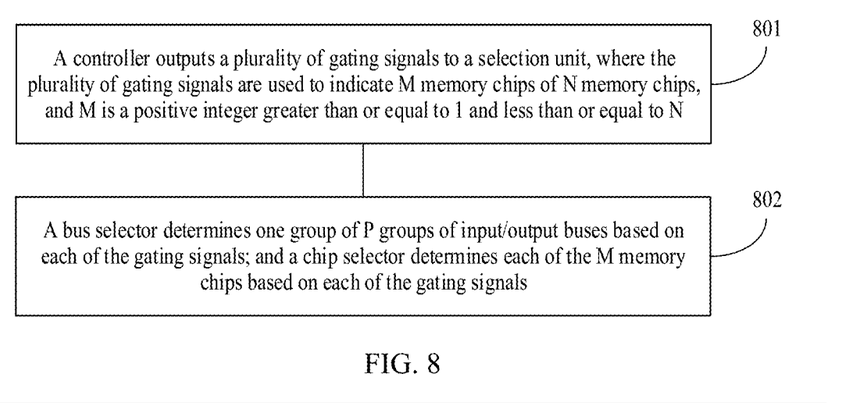
FIG. 8 is a flowchart of another solid-state storage drive control method according to an embodiment of this application.

FIG. 8 is a flowchart of another solid-state storage drive control method according to an embodiment of this application. The method is applied to a solid-state storage drive. The solid-state storage drive includes a controller, a selector, and N NAND flash memory chips, where N is a positive integer greater than 1. The N NAND flash memory chips form P NAND flash memory chip arrays, where P is an integer greater than or equal to 1 and less than or equal to N. The selector is coupled to the controller and the N NAND flash memory chips. A bus selector is connected to the P NAND flash memory chip arrays by using P groups of input/output buses, and a chip selector is connected to the N NAND flash memory chips, where P is a positive integer greater than or equal to 1. As shown in FIG. 8, the method includes the following steps.

Step 801: The controller outputs a plurality of gating signals to the selector, where the plurality of gating signals indicate M NAND flash memory chips of the N NAND flash memory chips, and M is a positive integer greater than or equal to 1 and less than or equal to N.

Step 802: The bus selector determines one group of the P groups of input/output buses based on each gating signal; and the chip selector determines each of the M NAND flash memory chips based on each gating signal.

In some embodiments, specifically, each of the gating signals includes a first signal bit group and a second signal bit. Optionally, the method further includes: The bus selector receives the first signal bit group in each of the gating signals, and determines one group of the P groups of input/output buses based on the first signal bit group; and the chip selector receives the first signal bit group and the second signal bit group in each of the gating signals, and determines each of the M NAND flash memory chips based on the first signal bit group and the second signal bit group. An NAND flash memory chip determined by the chip selector based on the first signal bit group and the second signal bit group of any gating signal corresponds to a group of input/output buses determined by the bus selector based on the first signal bit group of the same gating signal.

In an optional implementation, the bus selector includes a data selector MUX, and the chip selector includes a decoder.

Optionally, the selector receives an enabling signal sent by the controller; and controls, based on the enabling signal, whether to enable the selector.

In some embodiments, the method shown in FIG. 8 may be applied to the solid-state storage drive. The solid-state storage drive includes the controller, the selector, and the N NAND flash memory chips, where N is a positive integer greater than 1. The N NAND flash memory chips form the P NAND flash memory chip arrays, where P is an integer greater than or equal to 1 and less than or equal to N. The selector is coupled to the controller and the N NAND flash memory chips. The bus selector is connected to the P NAND flash memory chip arrays by using P groups of input/output buses, and the chip selector is connected to the N NAND flash memory chips, where P is a positive integer greater than or equal to 1. The method includes: The controller outputs the plurality of gating signals to the selector. The plurality of gating signals indicate the M NAND flash memory chips of the N NAND flash memory chips, where M is a positive integer greater than or equal to 1 and less than or equal to N. The bus selector determines, based on each gating signal, one group of the P groups of input/output buses. The chip selector determines each of the M NAND flash memory chips based on each gating signal. The bus selector and the chip selector are associated to perform gating among NAND flash memory chips. In an NAND flash memory chip gating process, software is not needed, so that software complexity is not increased. When an input/output bus is switched, gating is performed on an NAND flash memory chip connected to the input/output bus. In this way, a problem that an input/output bus of a solid-state storage drive with a large capacity is heavily loaded is effectively resolved, an interface rate of the solid-state storage drive with a large capacity is effectively improved, and a data read/write speed of the solid-state storage drive with a large capacity is effectively improved. A quantity of NAND flash memory chips of the solid-state storage drive is not limited, and a storage capacity of the solid-state storage drive is not affected, so that a coupling relationship between the interface rate and the storage capacity of the solid-state storage drive is well balanced, and requirements of both a high interface rate and a high storage capacity of the solid-state storage drive can be satisfied. Circuit implementation is simple, hardware costs are not high, and the solid-state storage drive is applicable to various solid-state storage drives that use a storage medium.

An embodiment of this application further provides a controller. The controller is used in a solid-state storage drive. The solid-state storage drive includes a selector and N NAND flash memory chips, where N is an integer greater than 1. The N NAND flash memory chips form P NAND flash memory chip arrays, where P is an integer greater than or equal to 1 and less than or equal to N. The selector is separately coupled to the controller and the N NAND flash memory chips. The controller is configured to output a plurality of gating signals to the selector, so that the selector selects, based on the plurality of gating signals, M NAND flash memory chips to perform data transmission. The plurality of gating signals indicate the M NAND flash memory chips of the N NAND flash memory chips, where M is an integer greater than or equal to 1 and less than or equal to N.

In an optional implementation, the selector includes a bus selector and a chip selector. The controller is separately connected to the bus selector and the chip selector. The bus selector is connected to the P NAND flash memory chip arrays by using P groups of input/output buses. The chip selector is connected to the N NAND flash memory chips.

The controller is configured to output the plurality of gating signals to the bus selector, so that the bus selector determines one group of the P groups of input/output buses based on each of the plurality of gating signals.

The controller is further configured to output the plurality of gating signals to the chip selector, so that the chip selector determines each of the M NAND flash memory chips based on each of the plurality of gating signals.

In an optional implementation, each of the gating signals includes a first signal bit group and a second signal bit group.

The controller is configured to output the first signal bit group in each of the plurality of gating signals to the bus selector, where the bus selector determines one group of the P groups of input/output buses based on the first signal bit group in each of the gating signals.

The controller is further configured to output the first signal bit group and the second signal bit group in each of the plurality of gating signals to the chip selector, so that the chip selector determines each of the M NAND flash memory chips based on the first signal bit group and the second signal bit group in each of the gating signals.

In an optional implementation, the controller is further configured to: send an enabling signal to the selector; and control, based on the enabling signal, whether to enable the selector.

According to an embodiment of this application, this application further provides a terminal device. The terminal device includes the solid-state storage drive described in the foregoing embodiments.

Figure 9:
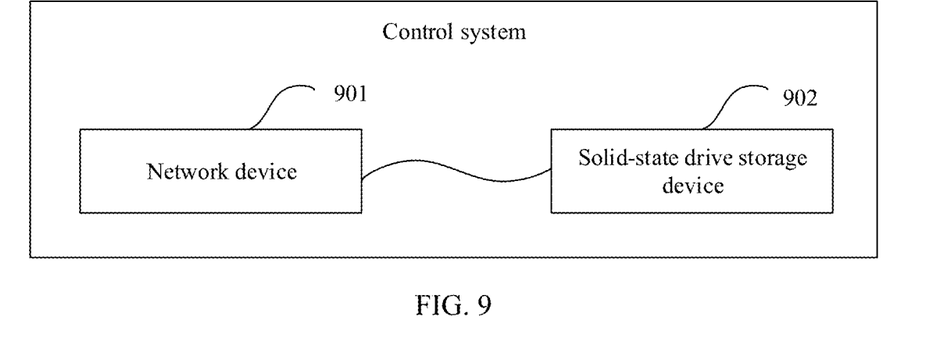
FIG. 9 is a schematic diagram of a structure of a control system according to an embodiment of this application.

FIG. 9 is a schematic diagram of a structure of a control system according to an embodiment of this application. As shown in FIG. 9, the control system includes a network device 901 and a solid-state storage drive 902. The solid-state storage drive 902 includes the solid-state storage drive described in any one of the foregoing embodiments.

According to the embodiments of this application, this application further provides an electronic device and a readable storage medium.

All or some of the foregoing embodiments may be implemented by using software, hardware, firmware, or any combination thereof. When software is used to implement the embodiments, the embodiments may be implemented completely or partially in a form of a computer program product. The computer program product includes one or more computer instructions. When the computer program instructions are loaded and executed on a computer, the procedure or functions according to the embodiments of this application are completely or partially generated. The computer may be a general-purpose computer, a dedicated computer, a computer network, or other programmable apparatuses. The computer instructions may be stored in a computer-readable storage medium or may be transmitted from a computer-readable storage medium to another computer-readable storage medium. For example, the computer instructions may be transmitted from a website, computer, server, or data center to another website, computer, server, or data center in a wired (for example, a coaxial cable, an optical fiber, or a digital subscriber line (DSL)) or wireless (for example, infrared, radio, or microwave) manner. The computer-readable storage medium may be any usable medium accessible by the computer, or a data solid-state storage drive, such as a server or a data center, integrating one or more usable media. The usable medium may be a magnetic medium (for example, a floppy disk, a hard disk, or a magnetic tape), an optical medium (for example, a DVD), a semiconductor medium (for example, a solid state drive (SSD)), or the like.

A person skilled in the art should be aware that in the foregoing one or more examples, functions described in embodiments of this application may be implemented by hardware, software, firmware, or any combination thereof. When the embodiments of this application is implemented by software, the foregoing functions may be stored in a computer-readable medium or transmitted as one or more instructions or code in the computer-readable medium. The computer-readable medium includes a computer storage medium and a communications medium. The communications medium includes any medium that facilitates transmission of a computer program from one place to another. The storage medium may be any available medium accessible to a general-purpose or special-purpose computer.

In the embodiments of this application, reference may be made to each other for the foregoing embodiments. Same or similar steps and nouns are not described one by one again.

It should be understood that various forms of processes shown above can be used to reorder, add, or delete steps. For example, the steps described in this application may be performed in parallel, or may be performed in sequence, or may be performed in different sequences, provided that an expected result of the technical solutions disclosed in this application can be implemented. This is not limited herein.

The foregoing specific implementations do not constitute any limitation on the protection scope of this application. A person skilled in the art should understand that various modifications, combinations, sub-combinations, and substitutions may be made according to design requirements and other factors. Any modification, equivalent replacement, and improvement made without departing from the principle of this application shall fall within the protection scope of this application.

What is claimed is:

1. A solid-state storage drive, comprising:
    a controller, a selector, and N NAND flash memory chips, wherein N is an integer greater than 1;
    the selector is separately coupled to the controller and the N NAND flash memory chips, wherein the selector comprises a bus selector and a chip selector, the chip selector is connected to the N NAND flash memory chips, and the bus selector is connected to P groups of input/output buses that are connected to P NAND flash memory chip arrays formed by the N NAND flash memory chips, where P is an integer greater than or equal to 1 and less then N;
    the controller is configured to output a plurality of gating signals to the selector, wherein the plurality of gating signals indicate M NAND flash memory chips of the N NAND flash memory chips, and M is an integer greater than or equal to 1 and less than or equal to N;
    the bus selector is configured to select one of the P groups of input/output buses by performing 1:P multiplexing on the plurality of gating signals; and
    the chip selector is configured to select, based on the plurality of gating signals, the M NAND flash memory chips to perform data transmission.

2. The solid-state storage drive according to claim 1, wherein the controller is separately connected to the bus selector and the chip selector and
    the chip selector is configured to determine each of the M NAND flash memory chips based on each of the gating signals.

3. The solid-state storage drive according to claim 2, wherein each of the gating signals comprises a first signal bit group and a second signal bit group;
    the bus selector is configured to determine one group of the P groups of input/output buses based on the first signal bit group; and
    the chip selector is configured to determine each of the M NAND flash memory chips based on the first signal bit group and the second signal bit group.

4. The solid-state storage drive according to claim 3, wherein an NAND flash memory chip determined by the chip selector based on the first signal bit group and the second signal bit group of a gating signal corresponds to a group of input/output buses determined by the bus selector based on the first signal bit group of the same gating signal.

5. The solid-state storage drive according to claim 4, wherein the bus selector comprises a data selector MUX, and the chip selector comprises a decoder.

6. The solid-state storage drive according to claim 1, wherein the selector is further configured to:
    receive an enabling signal sent by the controller; and
    control, based on the enabling signal, whether to enable the selector.

7. A controller, wherein the controller is used in a solid-state storage drive, the solid-state storage drive comprises a selector and N NAND flash memory chips, wherein N is an integer greater than 1;
    the selector is separately coupled to the controller and the N NAND flash memory chips, wherein the selector comprises a bus selector and a chip selector, the chip selector is connected to the N NAND flash memory chips, and the bus selector is connected to P groups of input/output buses that are connected to P NAND flash memory chip arrays formed by the N NAND flash memory chips, where P is an integer greater than or equal to 1 and less then N;

the controller is configured to output a plurality of gating signals to the selector, wherein the selector selects, based on the plurality of gating signals, M NAND flash memory chips to perform data transmission, wherein the plurality of gating signals indicate the M NAND flash memory chips of the N NAND flash memory chips, and M is an integer greater than or equal to 1 and less than or equal to N;

the controller is configured to output the plurality of gating signals to the bus selector to select one of the P groups of input/output buses by performing 1:P multiplexing on the plurality of gating signals; and the controller is configured to output the plurality of gating signals to the chip selector to select, based on the plurality of gating signals, the M NAND flash memory chips to perform data transmission.

8. The controller according to claim 7, wherein the controller is separately connected to the bus selector and the chip selector; and the controller is further configured to output the plurality of gating signals to the chip selector for the chip selector to determine each of the M NAND flash memory chips based on each of the plurality of gating signals.

9. The controller according to claim 8, wherein each of the gating signals comprises a first signal bit group and a second signal bit group;

the controller is configured to output the first signal bit group in each of the plurality of gating signals to the bus selector for the bus selector to determine one group of the P groups of input/output buses based on the first signal bit group in each of the gating signals; and the controller is further configured to output the first signal bit group and the second signal bit group in each of the plurality of gating signals to the chip selector for the chip selector to determine each of the M NAND flash memory chips based on the first signal bit group and the second signal bit group in each of the gating signals.

10. The controller of claim 7, wherein the controller is further configured to send an enabling signal to the selector and control, based on the enabling signal, whether to enable the selector.

11. A solid-state storage drive control method, wherein the method is applied to a solid-state storage drive, the solid-state storage drive comprises a controller, a selector, and N NAND flash memory chips, N is a positive integer greater than 1, wherein the selector comprises a bus selector and a chip selector, the chip selector is connected to the N NAND flash memory chips, and the bus selector is connected to P groups of input/output buses that are connected to P NAND flash memory chip arrays formed by the N NAND flash memory chips, where P is an integer greater than or equal to 1 and less then N, and wherein the method comprises:

outputting, by the controller, a plurality of gating signals to the selector, wherein the plurality of gating signals indicate M NAND flash memory chips of the N NAND flash memory chips, and M is a positive integer greater than or equal to 1 and less than or equal to N;

selecting, by the bus selector, one of the P groups of input/output buses by performing 1:P multiplexing on the plurality of gating signals; and selecting, by the selector based on the plurality of gating signals, the M NAND flash memory chips to perform data transmission.

12. The method according to claim 11, wherein the controller is separately connected to the bus selector and the chip selector, and the method further comprises:

determining, by the chip selector, each of the M NAND flash memory chips based on each of the gating signals.

13. The method according to claim 12, wherein each of the gating signal comprises a first signal bit group and a second signal bit group, and the method comprises:

receiving, by the bus selector, the first signal bit group in each of the gating signals, and determining one group of the P groups of input/output buses based on the first signal bit group; and receiving, by the chip selector, the first signal bit group and the second signal bit group in each of the gating signals, and determining each of the M NAND flash memory chips based on the first signal bit group and the second signal bit group.

14. The method according to claim 13, wherein an NAND flash memory chip determined by the chip selector based on the first signal bit group and the second signal bit group of a gating signal corresponds to a group of input/output buses determined by the bus selector based on the first signal bit group of the same gating signal.

15. The method according to claim 14, wherein the bus selector comprises a data selector MUX, and the chip selector comprises a decoder.

16. The method according to claim 11, wherein the method further comprises:

receiving, by the selector, an enabling signal sent by the controller; and controlling, based on the enabling signal, whether to enable the selector.

17. A terminal device, wherein the terminal device comprises a solid-state storage drive, which comprises:

a controller, a selector, and N NAND flash memory chips, wherein N is an integer greater than 1;

the selector is separately coupled to the controller and the N NAND flash memory chips, wherein the selector comprises a bus selector and a chip selector, the chip selector is connected to the N NAND flash memory chips, and the bus selector is connected to P groups of input/output buses that are connected to P NAND flash memory chip arrays formed by the N NAND flash memory chips, where P is an integer greater than or equal to 1 and less then N;

the controller is configured to output a plurality of gating signals to the selector, wherein the plurality of gating signals indicate M NAND flash memory chips of the N NAND flash memory chips, and M is an integer greater than or equal to 1 and less than or equal to N;

the bus selector is configured to select one of the P groups of input/output buses by performing 1:P multiplexing on the plurality of gating signals; and the selector is configured to select, based on the plurality of gating signals, the M NAND flash memory chips to perform data transmission.

18. The terminal according to claim 17, wherein the controller is separately connected to the bus selector and the chip selector and the chip selector is configured to determine each of the M NAND flash memory chips based on each of the gating signals.

19. The terminal according to claim 18, wherein each of the gating signals comprises a first signal bit group and a second signal bit group;

the bus selector is configured to receive the first signal bit group in each of the gating signals, and determine one group of the P groups of input/output buses based on the first signal bit group; and the chip selector is configured to receive the first signal bit group and the second signal bit group in each of the gating signals, and determine each of the M NAND flash memory chips based on the first signal bit group and the second signal bit group.

20. The terminal according to claim 19, wherein an NAND flash memory chip determined by the chip selector based on the first signal bit group and the second signal bit group of a gating signal corresponds to a group of input/output buses determined by the bus selector based on the first signal bit group of the same gating signal.

* * * * *

UNITED STATES PATENT AND TRADEMARK OFFICE
CERTIFICATE OF CORRECTION

| | | |
|---|---|---|
| PATENT NO. | : 12,204,752 B2 | Page 1 of 1 |
| APPLICATION NO. | : 17/886720 | |
| DATED | : January 21, 2025 | |
| INVENTOR(S) | : Yongjun Tang et al. | |

It is certified that error appears in the above-identified patent and that said Letters Patent is hereby corrected as shown below:

On the Title Page

In item (71), in "Applicant:", delete "GuangDong (CN)" and insert -- Shenzhen (CN) --.

Signed and Sealed this
Fifteenth Day of April, 2025

Coke Morgan Stewart
*Acting Director of the United States Patent and Trademark Office*